US007083290B2

(12) United States Patent
Masaki et al.

(10) Patent No.: US 7,083,290 B2
(45) Date of Patent: Aug. 1, 2006

(54) ADJUSTMENT METHOD AND APPARATUS OF OPTICAL SYSTEM, AND EXPOSURE APPARATUS

(75) Inventors: Fumitaro Masaki, Tochigi (JP); Akira Miyake, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 171 days.

(21) Appl. No.: 10/629,879

(22) Filed: Jul. 29, 2003

(65) Prior Publication Data

US 2004/0095662 A1 May 20, 2004

(30) Foreign Application Priority Data

Jul. 29, 2002 (JP) ............................. 2002-220389

(51) Int. Cl.
*G03B 21/00* (2006.01)
*G01B 11/24* (2006.01)

(52) U.S. Cl. .................... 353/122; 356/601; 359/580
(58) Field of Classification Search ................ 353/122; 356/601; 359/580
See application file for complete search history.

(56) References Cited

U.S. PATENT DOCUMENTS

| 6,504,896 | B1 | 1/2003 | Miyake et al. ................ 378/34 |
| 2002/0171922 | A1 | 11/2002 | Shiraishi et al. ............ 359/359 |
| 2003/0081722 | A1 | 5/2003 | Kandaka et al. .............. 378/70 |
| 2004/0174533 | A1* | 9/2004 | Nakauchi ..................... 356/515 |

FOREIGN PATENT DOCUMENTS

| EP | 1 291 680 A2 | 3/2003 |
| JP | 10-070058 | 3/1998 |
| JP | 2002-131489 | 5/2002 |
| JP | 2003-077805 | 3/2003 |

OTHER PUBLICATIONS

Taiwanese Office Action (Jun. 24, 2004) w/translation.
2$^{nd}$ International Workshop in EUV Lithography Source Oct. 17-19, "At Wavelength Testing of an EUVL Four Mirror Ring Field System" (Goldberg, et al LLBL, UC Berkeley, LLNL) (EUV Alignment and Testing of A 4-Mirror Ring-Field EUV Optical System) (Publication Date: Oct. 17, 2000.
SUB-NM, Figure Error Correction of a Multilayer Mirror by its Surface Milling:, Masaki Yamamoto, Nuclear Instruments and Method in Physics Research A., 467-468 (2001), pp. 1282-1285.

(Continued)

*Primary Examiner*—Christopher Mahoney
(74) *Attorney, Agent, or Firm*—Morgan & Finnegan, LLP

(57) ABSTRACT

A method for adjusting an optical system that has a multilayer mirror that includes a multilayer film includes the steps of measuring wave front aberration of the optical system, determining a condition to remove part of the multilayer film in the multilayer mirror so that the wave front aberration measured in the measuring step may reduce, and removing the part of the multilayer film in the multilayer mirror based on the condition determined by the determining step.

19 Claims, 14 Drawing Sheets

OTHER PUBLICATIONS

Patent Abstracts of Japan for 2003-077805.
Patent Abstracts of Japan for 2002-131489.
Japanese Patent Office Notice of Reasons for Rejection dated Apr. 19, 2005 with full English Translation.
South Korea Patent Office Notice of Remarks Filing for Korean Counterpart Application 10-2003-0052218 with full English Translation.
English translation of JP 2002-131489.
English translation of JP 2002-077805.
English Abstract of JP 2002-131489.
English Abstract of JP 2003-077805.
Japanese Office Action for Japanese Patent Application No. 2003-281566 dated Nov. 15, 2005.
English translation of Japanese Office Action for counterpart Japanese Patent Application No. 2003-281566.

* cited by examiner

780

ADJUSTMENT METHOD AND APPARATUS OF OPTICAL SYSTEM, AND EXPOSURE APPARATUS

This application claims a benefit of priority based on Japanese Patent Application No. 2002-220389, filed on Jul. 29, 2002, which is hereby incorporated by reference herein in its entirety as if fully set forth herein.

BACKGROUND OF THE INVENTION

The present invention relates generally to an adjustment method and apparatus for adjusting an exposure apparatus that exposes an object, such as a single crystal substrate for a semiconductor wafer (plate or ball), and a glass plate (wafer) for a liquid crystal display (LCD). The present invention is particularly suitable, for example, for an exposure apparatus that uses ultraviolet light and extreme ultraviolet ("EUV") light as a light source for exposure.

A reduction projection exposure apparatus has been conventionally employed which uses a projection optical system to project a circuit pattern formed on a mask (reticle) onto a wafer, etc. to transfer the circuit pattern, in manufacturing such a fine semiconductor device as a semiconductor memory and a logic circuit in photolithography technology.

The minimum critical dimension to be transferred by the projection exposure apparatus or resolution is proportionate to a wavelength of light used for exposure, and inversely proportionate to the numerical aperture ("NA") of the projection optical system. The shorter the wavelength is, the better the resolution is. Along with recent demands for finer semiconductor devices, a shorter wavelength of ultraviolet light has been promoted from an ultra-high pressure mercury lamp (i-line with a wavelength of approximately 365 nm) to KrF excimer laser (with a wavelength of approximately 248 nm) and ArF excimer laser (with a wavelength of approximately 193 nm).

However, the lithography using the ultraviolet light has the limit to satisfy the rapidly promoting fine processing of a semiconductor device, and a reduction projection optical system using extreme ultraviolet ("EUV") light with a wavelength of 10 to 15 nm shorter than that of the ultraviolet has been developed to efficiently transfer a very fine circuit pattern of 0.1 μm or less.

As the light absorption in a material remarkably increases in a wavelength range of the EUV light, making impractical a refraction-type optical system for visible light and ultraviolet light, a reflection-type or cataoptric optical system is used for an exposure apparatus that uses the EUV light ("EUV exposure apparatus"). A reflection-type reticle is used which forms a pattern to be transferred, on an absorber on a mirror.

The EUV exposure apparatus uses as a cataoptric element a multilayer mirror that alternately forms or layers two kinds of materials, e.g., molybdenum (Mo)/silicon (Si), having different optical constants on a precisely polished glass plate. For example, a molybdenum layer is about 2 nm thick, and a silicon layer is about 5 nm thick. A sum of thickness of two kinds of materials is generally called a coating cycle, which is 2 nm+5 nm=7 nm in the above example.

The multilayer mirror reflects EUV light with a specific wavelength when receiving EUV light. Efficiently reflected EUV light is one within a narrow bandwidth around λ that satisfies Equation 1 below where λ is a wavelength of the reflected EUV light, θ is an incident angle and d is a coating cycle and the bandwidth is about 0.6 to 1 nm:

$$2 \cdot d \cdot \cos \theta = \lambda \quad (1)$$

The reflectance of the EUV light would be about 0.7 at most. Non-reflected EUV light is absorbed in the multilayer film or plate, and most of the energy is consumed as heat. The number of multilayer mirrors should be maintained minimum for maximum reflectance in the entire optical system.

A typical projection optical system for the EUV light includes about four to six multilayer mirrors, which have a plane, concave or convex spherical or aspheric reflective surface.

A multilayer mirror in the projection optical system requires very high precision for its surface shape. For example, a permissible figure error σ (rms value) is given in Equation 2 below where n is the number of multilayer mirrors in the projection optical system, and λ is a wavelength of the reflected EUV light:

$$\sigma = \frac{\lambda}{28 \times \sqrt{n}} \quad (2)$$

For example, four multilayer mirrors in the projection optical system that uses the EVU light with a wavelength of 13 nm is permitted to have a figure error σ of 0.23 nm. The wave front aberration amount is about 0.4 nm for resolution of 30 nm pattern transfer, which is permitted for the whole projection optical system.

Only polishing has a difficulty in making a figure error fall within the above permissible range. In addition, errors are inevitable due to gravity drawdown and alignment errors in combining plural polished multilayer mirror even when they are sufficiently precisely polished. For example, wave front aberration of about 1 nm remains in the whole projection optical system even after repetitive alignments according to the disclosure in "2nd International Workshop on EUV Lithography Source Oct. 17–19, 2000", DESCRIPTION: At Wavelength Testing of an EUVL Four Mirror Ring Field System, PRESENTOR/AUTHOR: Goldberg, et al., COMPANY: LLBL, UC Berkeley, LLNL. In other words, since multilayer mirrors or plates in the projection optical system includes figure errors, alignment errors, errors due to their own weights, an object to be exposed, such as a wafer, has wave front offset from an ideal wave front obtained through calculation or so-called wave front aberration. As a result, the projection optical system exhibits insufficient imaging performance, lowered resolution and contrast and cannot transfer a fine pattern transfer satisfactorily.

BRIEF SUMMARY OF THE INVENTION

Accordingly, it is an exemplary object of the present invention to provide an adjustment method and apparatus for adjusting an optical system, and an exposure apparatus, which stably transfer a fine pattern with EUV light as well as other types of light.

A method of one aspect of the present invention for adjusting an optical system that has a multilayer mirror that includes a multilayer film includes the steps of measuring wave front aberration of the optical system, determining a condition to remove part of the multilayer film in the multilayer mirror so that the wave front aberration measured in the measuring step may reduce, and removing the part of the multilayer film in the multilayer mirror based on the condition determined by the determining step. The condition may define a removal area and/or a removal amount.

The method may further include the steps of calculating an adjustment amount of the multilayer mirror so that the wave front aberration measured in the measuring step may reduce, adjusting the multilayer mirror based on the adjustment amount calculated by the calculating step, and repeating the measuring step, the calculating step and the adjusting step so that the wave front aberration may reduce. The adjustment amount may include a position and/or angle of the multilayer mirror.

The method may further include the step of repeating the measuring step, the calculating step and the adjusting step so that the wave front aberration may reduce. The optical system may include plural multilayer mirrors.

The measuring step may measure the wave front aberration using EUV light. The measuring step may measure the wave front aberration using ultraviolet light, visible light or infrared light.

The removing step may remove the part of the multilayer film in the multilayer mirror using sputtering or ion beam milling.

An adjustment apparatus of another aspect of the present invention for adjusting an optical system that has a multilayer mirror that includes a multilayer film includes a measurement part for measuring wave front aberration of the optical system, a removal part for removing part of the multilayer film in the multilayer mirror, and a controller for determining a condition to remove the part of the multilayer film in the multilayer mirror based on the wave front aberration measured by the measurement part, and for controlling the removal part to remove the part of the multilayer film in the multilayer mirror in accordance with the condition that has been determined. The adjustment apparatus may be part of an optical apparatus.

An optical system including a multilayer mirror that includes a multilayer film, which is adjusted by the above adjustment method also constitutes another aspect of the present invention. An exposure apparatus comprising such an optical system also constitutes another aspect of the present invention.

A device fabrication method of another aspect of this invention includes the steps of exposing a plate by using the above exposure apparatus, and performing a predetermined process for the exposed object. Claims for a device fabrication method for performing operations similar to that of the above exposure apparatus cover devices as intermediate and final products. Such devices include semiconductor chips like an LSI and VLSI, CCDs, LCDs, magnetic sensors, thin film magnetic heads, and the like.

Other objects and further features of the present invention will become readily apparent from the following description of the preferred embodiments with reference to accompanying drawings.

DETAILED DESCRIPTION OF THE PREFERRED EMBODIMENTS

Figure 2:
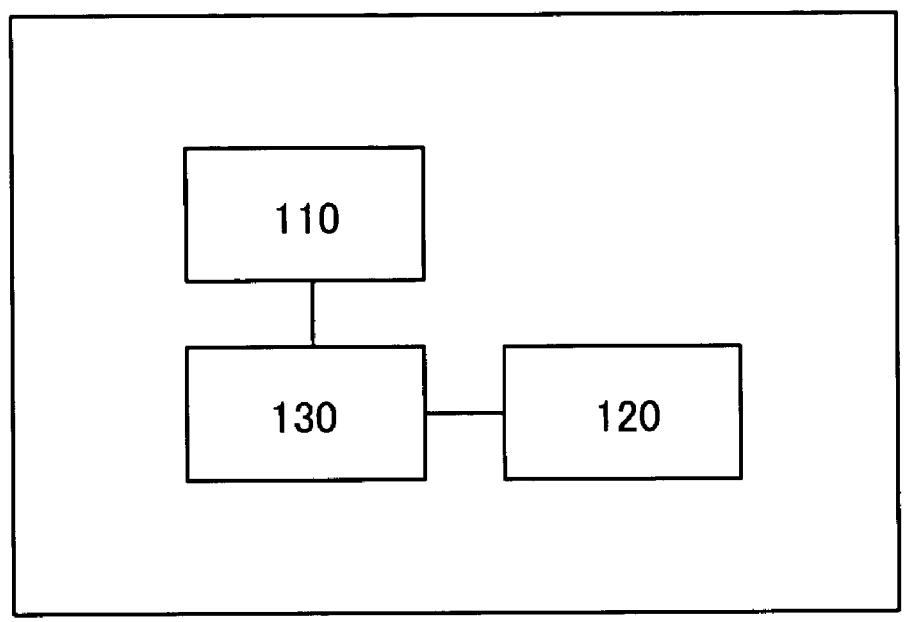
FIG. 2 is a schematic block diagram of an adjustment apparatus according to the present invention.

With reference to accompanying drawings, a description will now be given of an adjustment method and apparatus of one embodiment according to the present invention. The present invention is not limited to the embodiment, and each element is replaceable within a scope of the object of the present invention. Here, FIG. 2 is a schematic block diagram of an inventive adjustment apparatus 100.

The adjustment apparatus 100 uses coating milling to adjust an optical system that uses a multilayer mirror. The coating milling has been known as a method for correcting a surface shape of a plate in each multilayer mirror as proposed in "SUB-nm, Figure Error Correction of a Multilayer Mirror by Its Surface Milling", Masaki Yamamoto, Nuclear Instruments and Method in Physics Research A., 467–468 (2001), pp. 1282–1285. A description will be given of the coating milling with reference to FIGS. 3 to 8.

Figures 3A, 3B:
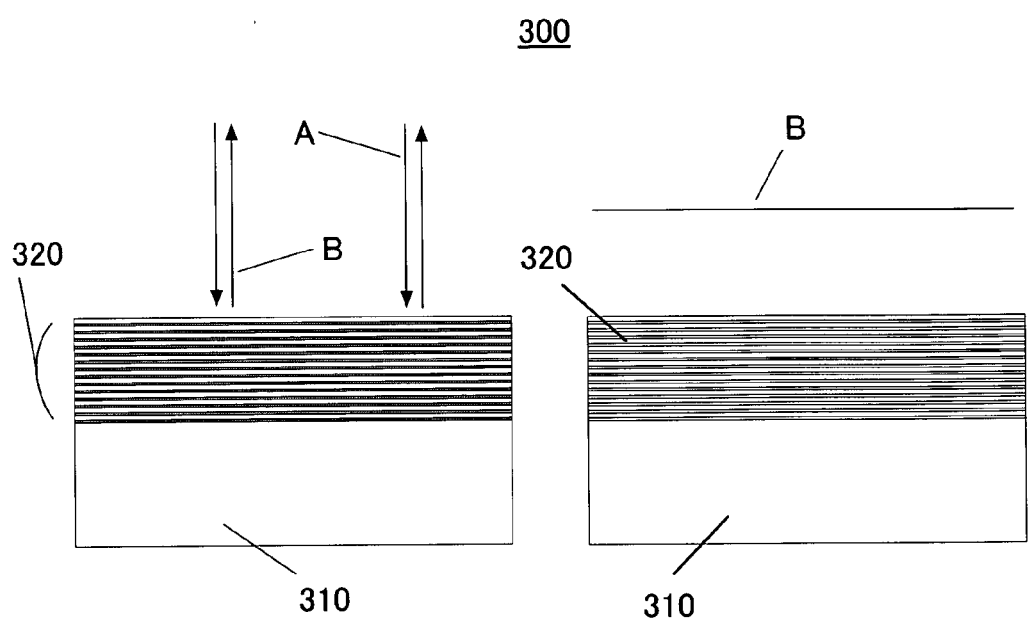
FIG. 3 is a schematic typical view showing a relationship between incident light and reflected wave front in a multilayer film where the number of layers is uniform according to locations.
Figure 4A:
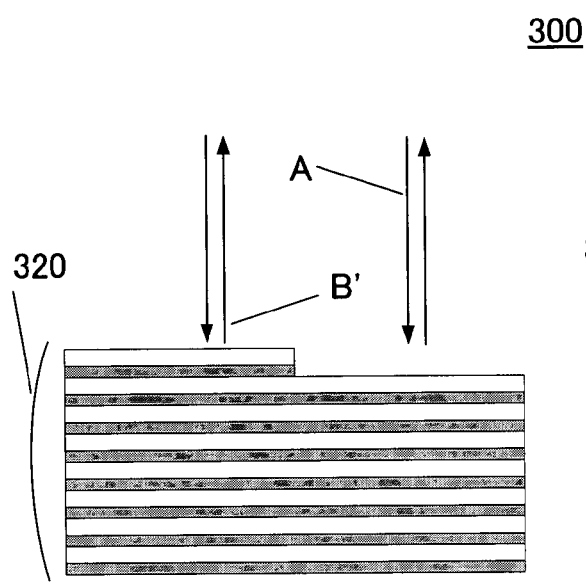
FIG. 4 is a schematic typical view showing a relationship between incident light and reflected wave front in a multilayer film where the number of layers is non-uniform according to locations.
Figure 4B:
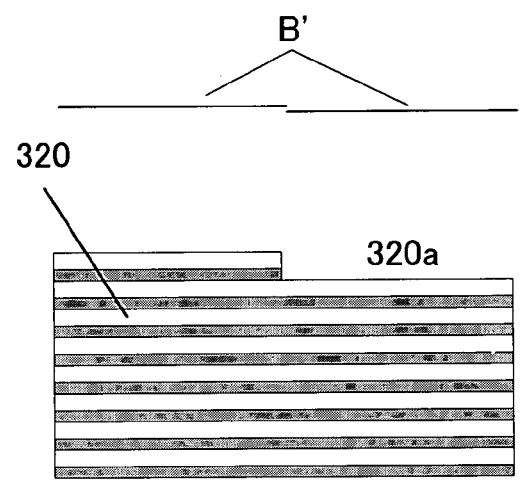

As shown in FIG. 3A, parallel light A with an equal phase incident upon a multilayer mirror 300 that uniformly forms a multilayer film 320 on a plane mirror substrate 310 would provide reflected light B having a completely equal phase or reflected wave front as shown in FIG. 3B. On the other hand, as shown in FIG. 4A, wave front B' of the reflected light from part 320a, at which one pair of films form unevenness on the multilayer film 320, forms a phase difference as shown in FIG. 4B. Here, FIG. 3 is a schematic typical view showing a relationship between incident light and reflected wave front in a multilayer film having a uniform layer surface. FIG. 4 is a schematic typical view showing a relationship between incident light and reflected wave front in a multilayer having a difference of one layer pair according to locations.

Figure 5:
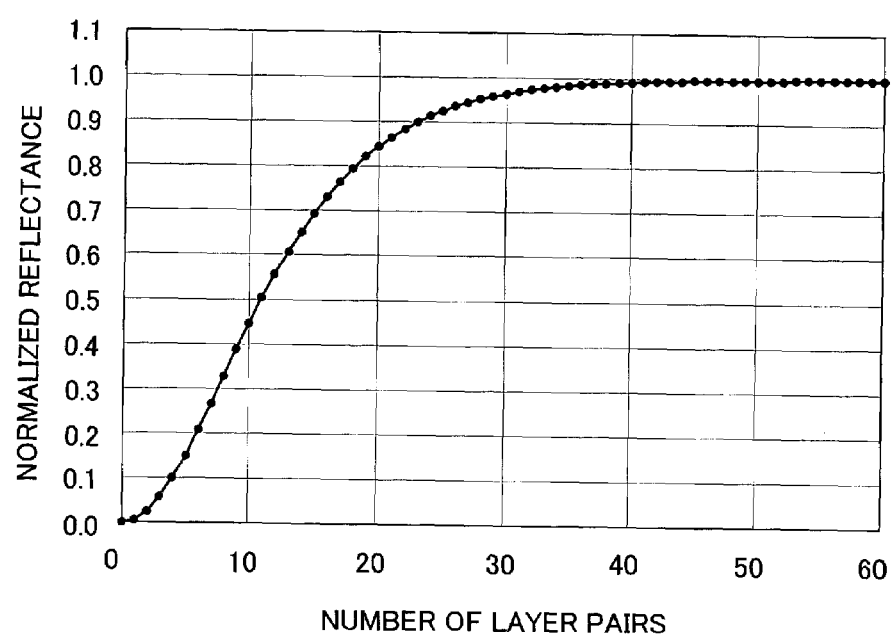
FIG. 5 is a graph showing reflectance characteristic of the multilayer film.

The reflectance of the multilayer mirror depends upon the number of layer pairs of the multilayer film. FIG. 5 is a graph showing reflectance characteristic of the multilayer film, where the abscissa axis shows the periodicity of the multilayer film while the ordinate axis shows the reflectance normalized by the maximum value. Referring to FIG. 5, the reflectance increases with the increased periodicity up to the forty layer pairs, and saturates above the forty layer pairs. If a multilayer film has been layered with sufficient periodicity, e.g., sixty layer pairs after the reflectance saturates, a difference in periodicity in the multilayer film would affect only wave front.

Figure 6A:
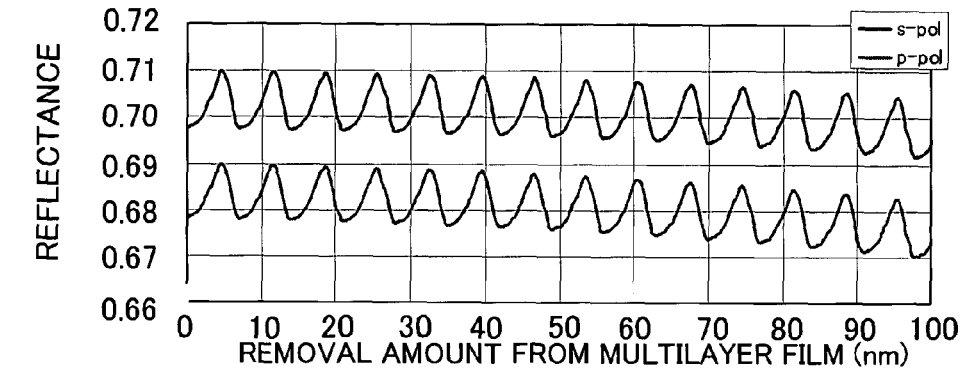
FIG. 6 is a graph to show an effect of removing part from the multilayer film.
Figure 6B:
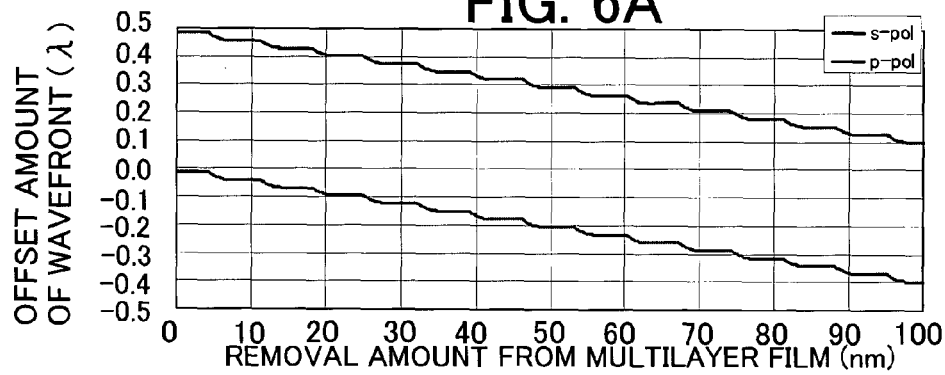
Figure 6C:
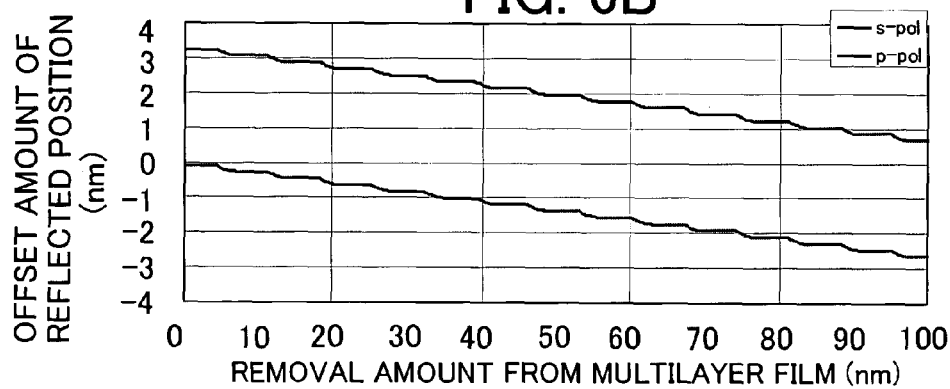

Suppose that the EUV light of 13.5 nm is incident at an angle of 10° upon a Mo/Si multilayer mirror, and the multilayer film is removed from its top layer while the top layer is set to be an origin in the multilayer film. The removal amount from the multilayer film is referred to as a removal amount. FIG. 6A is a graph of a relationship between the removal amount of the multilayer film and reflectance, while FIG. 6B shows a graph between the removal amount of the multilayer film and the wave front offset amount, when the EUV light of 13.5 nm is incident at an angle of 10° upon a Mo/Si multilayer mirror. In general, a Mo/Si multilayer arranges the Si layer as the uppermost layer to reduce the influence of the oxidization of Mo, and the instant embodiment has calculated on the assumption that the Si layer is located as the uppermost layer. It is understood from FIGS. 6A and 6B that as one layer pair of 6.99 nm is removed from the multilayer film, the wave front of the reflected light moves by about 0.025 wavelength. FIG. 6C shows a graph that converts an offset amount of wave front into an offset amount of a spatial reflection position. The offset amount L of a spatial reflection position is given in Equation 3 below where λ is a wave front of incident light and W is an offset amount of wave front:

$$\lambda \times W = 2L \quad (3)$$

Referring to FIG. 6C, a removal of one layer pair of 6.99 nm from the multilayer film means about 0.2 nm movement of the reflected position in the instant embodiment. As understood from FIG. 6A, the coating milling changes the index and wave front in the Mo layer more greatly than those in the Si layer due to a relationship of reflectance. As discussed, as the reflectance saturates for the periodicity of a multilayer film that has about sixty layer pairs, a removal of one layer pair would change the wave front without changing the reflectance.

Use of a relationship described with reference to FIGS. 3 to 6 would easily correct about 0.2 nm by a removal of one layer pair of 6.99 nm from the multilayer film.

Figure 7A:
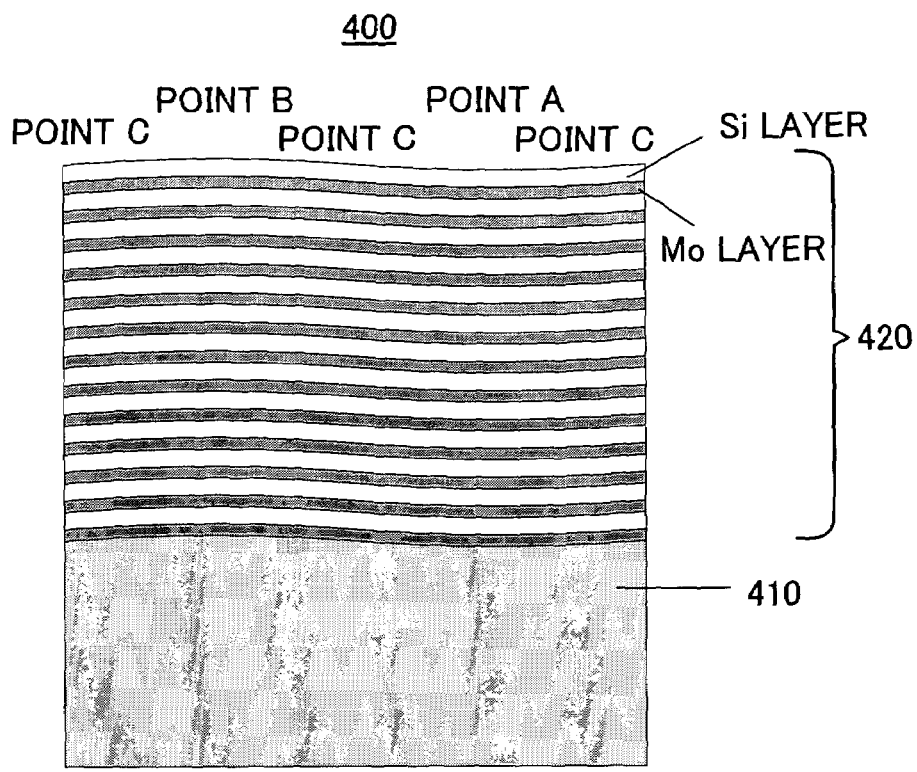
FIG. 7 is a schematic sectional view of a multilayer mirror that forms a multilayer film on a distorted mirror surface.
Figure 7B:
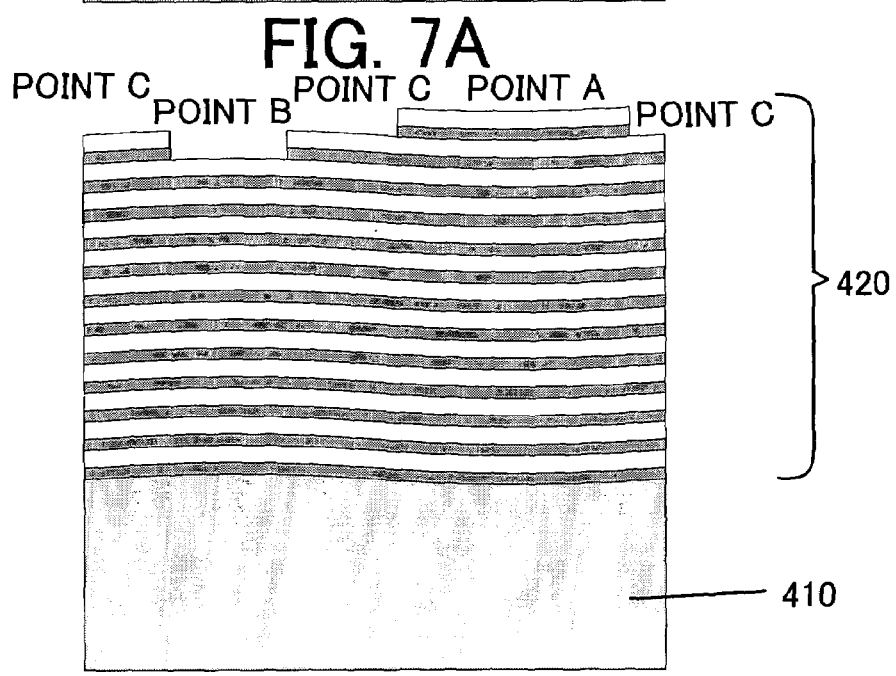

For example, suppose as shown in FIG. 7A, a multilayer mirror 400 that uniformly forms a multilayer film 420 on a distorted mirror substrate 410. The coating milling is an approach to delay a phase, and applied to a point A as an origin having the latest phase. As shown in FIG. 6, the Si layer a little changes the wave front, whereas the Mo layer changes the wave front greatly and, as described above, is weak to oxidization. Therefore, without special coating, it is not desirable to finish coating milling in the middle of the Mo layer and continuously adjust the wave front. As shown in FIG. 7B, the wave front is adjusted discontinuously by removing every layer pair of Mo and Si. On the other hand, since the Si layer has resistance to oxidation and does not affect the wave front, the coating milling may end in the middle of the Si layer. As discussed, when the EUV light of 13.5 nm is incident at an angle of 10°, a removal of one layer pair of 6.99 nm from the multilayer film may easily correct the spatial reflection position or a figure error of the mirror substrate every 0.2 nm. FIG. 7 is a schematic sectional view of the multilayer mirror 400 that uniformly forms the multilayer film 420 on the distorted mirror surface 410, wherein FIGS. 7A and 7B respectively shows the multilayer mirror 400 before and after the coating milling.

Referring to FIGS. 7A and 7B, when a surface shape of the mirror substrate 410 has a figure error of 0.4 nm at a point B and a figure error of 0.2 nm at a point C viewed from the point A, the wave front aberration caused by the figure error of the mirror substrate 410 may be corrected by removing two layer pairs from the multilayer film 420 at the point B and one layer pair from the multilayer film 420 at the point C.

Figure 8A:
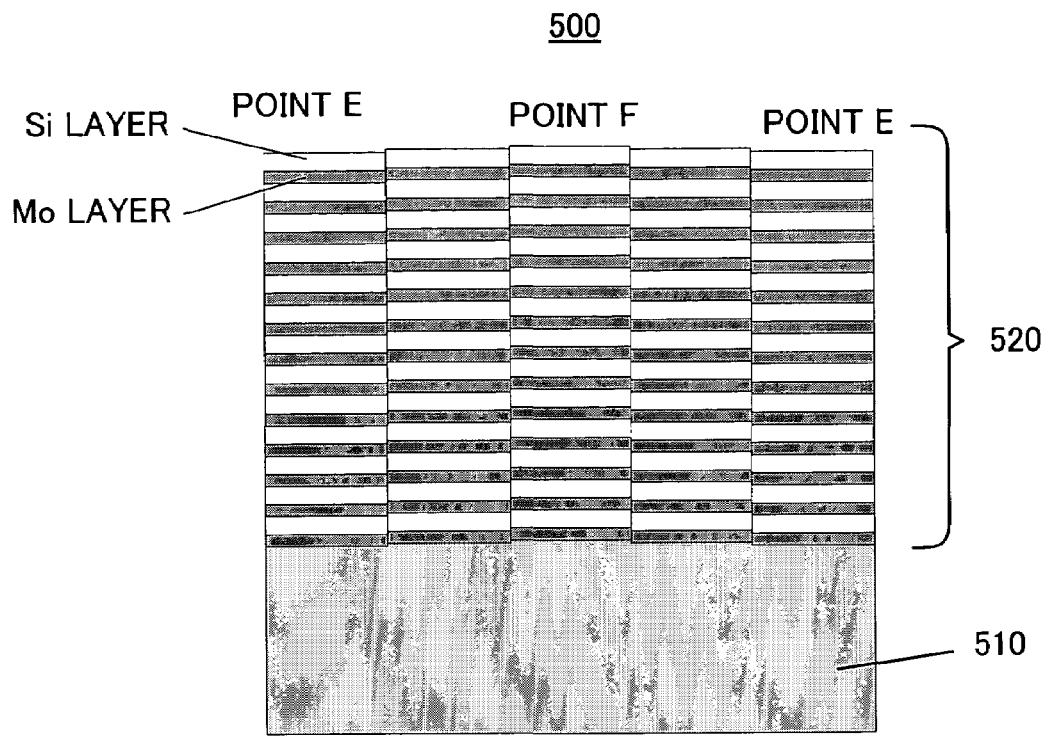
FIG. 8 is a schematic sectional view of a multilayer mirror that forms a multilayer film on a mirror surface that swells at the center above the peripheral.
Figure 8B:
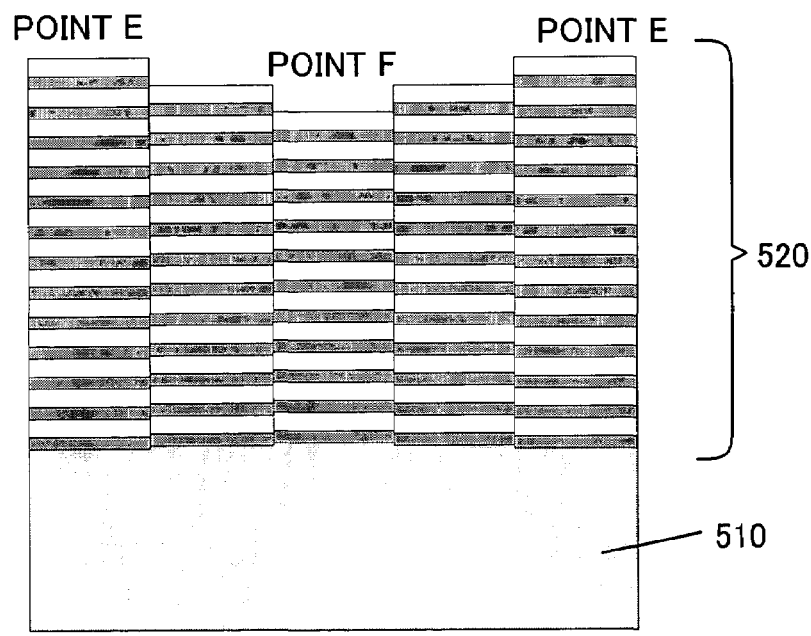

Similarly, as shown in FIG. 8A, for example, suppose a multilayer mirror 500 that uniformly forms a multilayer film 520 on a mirror substrate 510 that has a point F at a center part above a point E on the edge. Since the point E has relatively the latest phase in the multilayer mirror 500, the coating milling is applied to a point E as an origin. Referring to FIGS. 8A and 8B, when the mirror substrate 510 has a figure error of about 0.4 nm between the edge point E and the center point F, and the figure error changes continuously, two layer pairs are removed from the multilayer film 520 at the center point F. The wave front aberration caused by the figure error may be corrected by removing one layer pair at both sides. In either case, it is preferable to stack sufficient layers so that the reflectance does not change even when some layer films are removed. Here, FIG. 8 is a schematic sectional view of the multilayer mirror 500 that forms the multilayer film 520 on the mirror substrate 510 that swells at the center point F above the edge point E, wherein FIGS. 8A and 8B respectively shows the multilayer mirror 500 before and after the coating milling.

The adjustment apparatus 100 includes, as shown in FIG. 2, a measurement part 110, a removal part 120, and a control part 130.

The measurement part 110 measures the wave front aberration of the entire optical system, and includes a wave front aberration measurement apparatus, such as a Point Diffraction Interferometer ("PDI"). A description will be given of the PDI based on a projection optical system in an exposure apparatus as an example of an optical system. A pinhole is located on a surface corresponding to a reticle surface in the exposure apparatus to generate a spherical wave of (EUV, ultraviolet visible, infrared, etc.) light from the pinhole. A diffraction grating splits a beam into two located downstream the pinhole, and one beam is introduced into a detector at a wafer surface position through the projection optical system, and the other beam is introduced into a detector as reference wave front. The wave front aberration caused by the projection optical system is observed through interference between two wave fronts on the detectors. The above method finishes an observation of the wave front aberration at one point on the wafer surface. The wave front aberration in the whole projection optical system is measured over the entire illumination area on the reticle by moving a pinhole position on the reticle surface.

The removal part 120 partially removes the multilayer using, for example, sputtering or ion beam milling. The sputtering injects accelerated ions into a surface of the multilayer mirror or a multilayer film strips off atoms, and removes a portion of multilayer film. In etching, the ion beam milling maintains an ion source in a positive potential state, generates plasma using inert gas, draws insert gas ions from the ion source, irradiates the ions onto the multilayer mirror.

The control part 130 is connected to the measurement part 110 and the removal part 120, and the measurement part 110 determines conditions to remove the multilayer film, such as a removal area and removal amount, based on the wave front aberration measured by the measurement part 110, and controls the removal part 120 to remove the part of the multilayer mirror in accordance with the determined condition. The control part 130 calculates an adjustment amount of the multilayer mirror, such as a position and an angle, based on the wave front aberration measured by the measurement part 110.

First Embodiment

Figure 1:
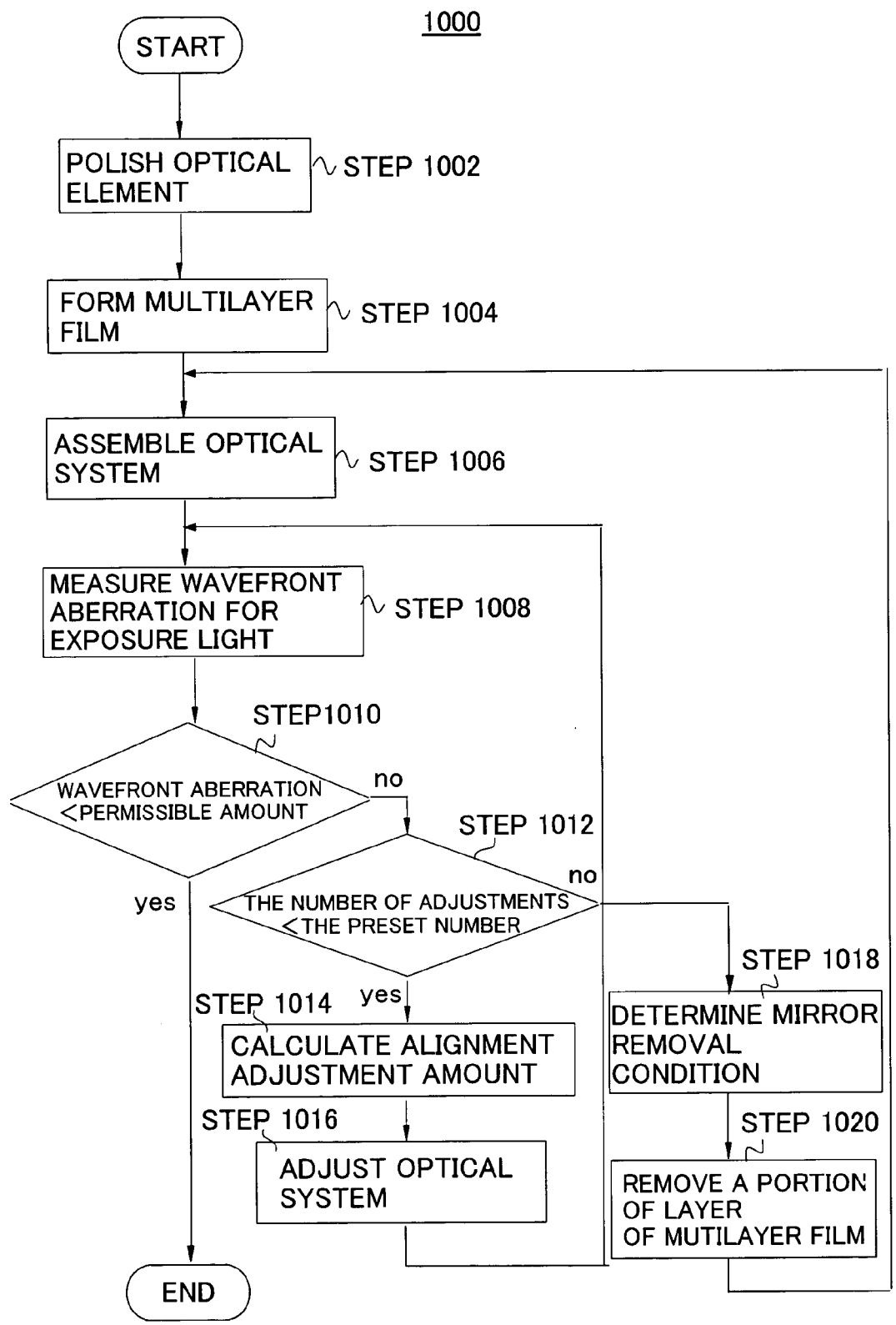
FIG. 1 is a flowchart for explaining an adjustment method of the present invention.

A description will be given of an inventive adjustment method 1000 that uses the above adjustment apparatus 100. FIG. 1 is a flowchart for explaining the inventive adjustment method. Here, a description will be given of an exemplary adjustment of the projection optical system including a Mo/Si multilayer mirror in an exposure apparatus.

As expressed by Equation 2, each Mo/Si multilayer mirror is polished with sufficient surface precision in the projection optical system (step 1002). A multilayer film is formed by alternately layering Mo and Si on a mirror surface that has been polished with sufficient surface precision (step 1004). For example, the entire mirror layers a multilayer film that a Mo layer has a thickness of about 2 nm and a Si layer has a thickness of about 5 nm.

Next, the multilayer mirror is assembled into a mirror barrel of the projection optical system (step 1006). The measurement part 110 measures the wave front aberration of the projection optical system on the wafer surface (step 1008). When the projection optical system uses a wavelength of the EUV light, the wave front aberration is measured using the EUV light having a wavelength to be used.

The measured wave front aberration is compared with a permissible amount (step 1010), and the assembly into the mirror barrel finishes when the wave front aberration is within the permissible range, e.g., equal to or smaller than 0.4 nm in case of transfer of resolution 30 nm. When the wave front aberration is outside the permissible range, the number of adjustments of a mirror position is compared with the preset number (step 1012), if it is within the preset number, the control part 130 calculates the alignment amount, such as a position and/or angle of the mirror, of the mirror based on the measured wave front aberration result (step 1014). Alternatively, the control part 130 may utilize a table that correlates a rotation and movement of each mirror with a change of generated wave front, which table has been obtained through calculation.

The control part 130 adjusts a mirror in the projection optical system based on a calculated alignment adjustment amount (step 1016). The measurement part 110 measures the wave front aberration after a mirror is adjusted by a calculated amount using the EUV light (step 1008). The assembly finishes when the measured wave front aberration is within the permissible range (step 1010). When the wave front aberration is outside the permissible range (step 1010), the procedure is repeated from the measurement of the wave front aberration by the measurement part 110 (step 1008) to the adjustment of mirror (step 1016). The alignment follows to minimize the wave front aberration generated in the projection optical system. Since it is difficult that only the adjustment of the mirror position completely eliminates the wave front aberration generated by a surface figure error of the mirror substrate and bending due to the mirror's own weight, the number of adjustments of the mirror position should be preset.

Where the wave front aberration amount is still outside the permissible range even when the number of adjustments of the mirror position reaches the present number (step 1012), the wave front aberration measured by the measurement part 110 on the wafer surface is the wave front aberration for the entire projection optical system. The coating milling does not have to be provided for each mirror, and a specific mirror is selected as an object of the coating milling to correct the wave front aberration of the entire projection optical system. The number of specific mirrors is not limited to one and may be plural. The control part 130 determines conditions, such as a correction amount and place, to remove part of the multilayer film in the mirror based on the measurement result of the wave front aberration. After the mirror is taken out of the mirror barrel for coating milling, the removal part 120 removes the multilayer film at a desired position from the mirror (step 1020).

The mirror is assembled into the mirror barrel after the coating milling (step 1006), and the procedure from the measurement of the wave front aberration by the measurement part 110 (step 1008) to the adjustment of mirror (step 1016) is repeated. When the wave front aberration does not fall within the permissible range, the mirror is corrected by the coating milling and similar steps are repeated.

The procedure from the step 1008 to the step 1020 is repeated, and an adjustment of the optical system ends when the wave front aberration of the entire system falls within a permissible range measurement.

After that, light, such as ultraviolet light, visual light, and infrared light, different from the exposure light may be used to measure the wave front aberration of the projection optical system and obtain mirror information on an angle and position of the mirror. Based on the mirror information, the wave front aberration measurement apparatus that has been incorporated into an exposure apparatus itself, which will be described later, may measure the wave front aberration using light different from the exposure light, while the projection optical system is incorporated into the exposure apparatus.

Second Embodiment

In measuring wave front aberration of the projection optical system using ultraviolet light, visible light, and infrared light, it is difficult to measure the wave front at the area that has experienced coating milling with the wavelength of the ultraviolet light, visible light, and infrared light. The multilayer film in the area that has experienced coating milling includes such steps that wave front observed using the ultraviolet light, visible light, and infrared light greatly shifts unlike the observation of the wave front aberration of the EUV wavelength. Therefore, in measuring the wave front aberration using the ultraviolet light, visible light, and infrared light, it is difficult that the procedure is repeated from the step 1006 to the step 1020 for plural times of coating milling as discussed above.

Accordingly, the following method may be used to adjust the optical system. A description will now be given of an adjustment of an optical system for measuring the wave front aberration using the ultraviolet light, visible light, and infrared light with reference to FIG. 12. The procedure up to the step 1016 is the same as that for the measurement of the wave front aberration using the EUV light, which has been described with reference to FIG. 1. Step 1008 measures the wave front aberration at the exposure wavelength.

Figure 12:
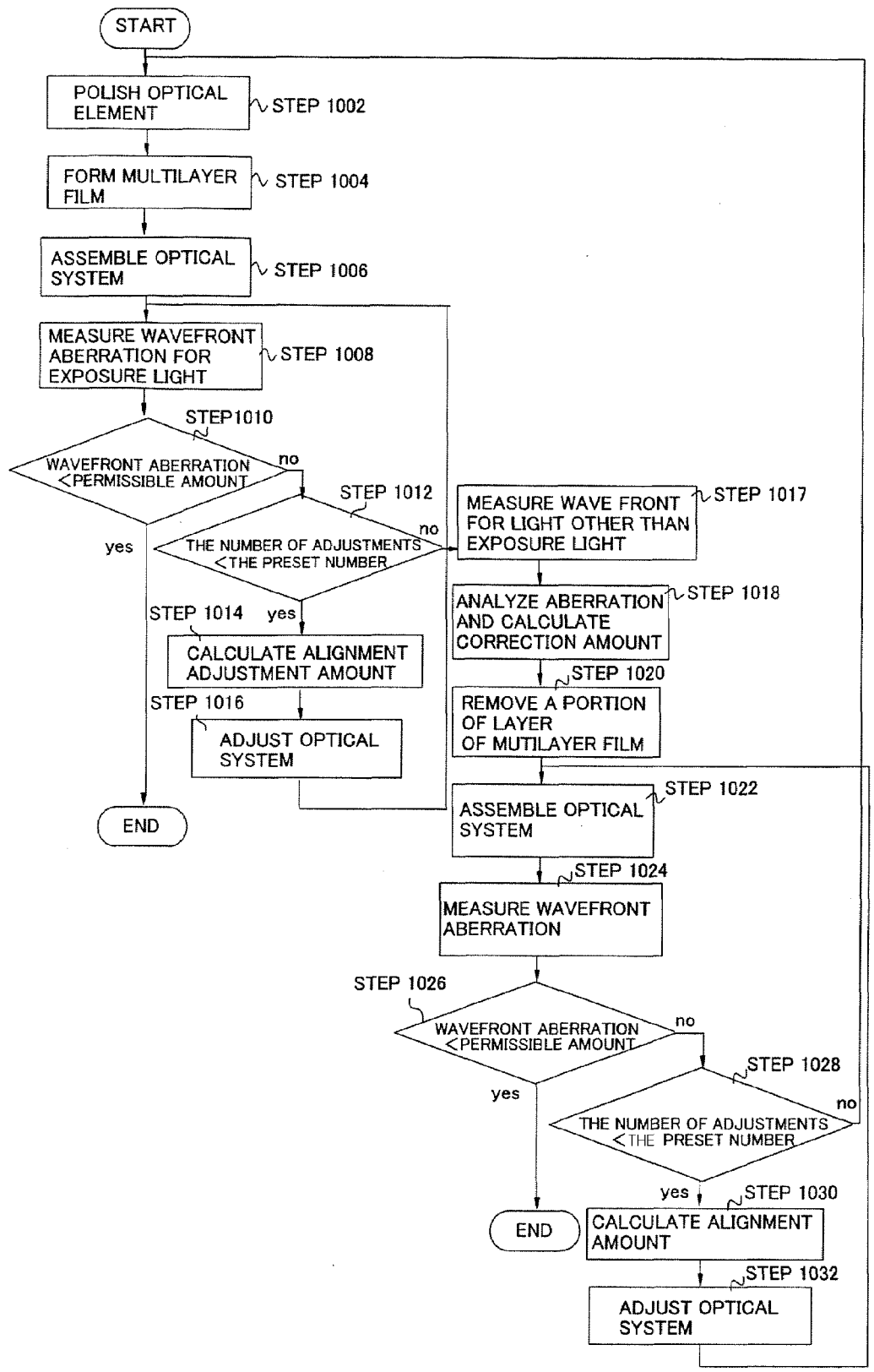
FIG. 12 is another adjustment method according to the present invention.

Even in FIG. 12, if the amount of the wave front aberration exceeds a permissible value, even when the number of mirror position adjustments reaches the prescribed times (step 1012), the above coating milling is provided. Before the coating milling is provided, the above wave front aberration measurement apparatus uses light other than the exposure light and measures a wave front of an optical system so as to obtain mirror information, such as an angle and position of the mirror (step 1017). In the subsequent steps 1020 and 1022, the mirror is taken out of the mirror barrel and the coating milling is provided. After the milling ends, the mirror is again incorporated into the mirror barrel and the information is used to reproduce the mirror's position, etc. While this embodiment uses an interferometer that uses light other than the exposure light, the present invention is not limited to this approach as long as the mirror's position may be reproduced. The light other than the exposure light includes, for example, ultraviolet light, visible light, and infrared light.

The measurement part 110 measures the wave front aberration, and the control part 130 determines conditions to remove part of multilayer film in the mirror based on the measurement result (step 1018). The mirror as an object of the coating milling is taken out of the mirror barrel, and the removal part 120 removes multilayer film at desired location (step 1020).

Further, the mirror is assembled into an optical system (step 1022) and the wave front aberration is measured (step 1024). Here, the wave front measured after the coating milling is observed to show that the wave front shifts greatly from that measured in the step 1017.

Accordingly, the area that has experienced the coating milling is removed and the wave front aberration is measured. A method of removing the area that has experienced the coating milling may provide a mask on the multilayer mirror to shield light corresponding to the area that has experienced the coating milling, or delete from wave front measurement data in data processing, data corresponding to the area that has experienced the coating milling.

The measured wave front aberration is compared with a permissible amount (step 1026), and the adjustment to the optical system is completed when the wave front aberration is within the permissible range. When the wave front aberration is outside the permissible range, the number of adjustments of a mirror position is compared with the preset number (step 1028). If it is within the preset number, the alignment adjustment is repeated from the step 1022 to the step 1032. The permissible value is determined by the mirror information obtained at the step 1017.

Where the wave front aberration amount is still outside the permissible range even when the number of adjustments of the mirror position reaches the present number (step 1028), the procedure from polishing of the optical element (step 1002) is repeated again.

This adjustment method may provide a projection optical system whose wave front aberration has been corrected.

Third Embodiment

In the first and second embodiments, the step 1008 uses the exposure light or the EUV light to measure the wave front aberration. The wave front measurement using the exposure wavelength often needs large facility, such as a synchrotron light source. On the other hand, given a relationship between the wave front measured by the exposure light and the wave front measured by the light, such as ultraviolet light, visible light, and infrared light, other than the exposure light, the wave front measurement using the light other than the exposure light provides information on the wave front measured by the exposure light, without requiring the large facility.

The relationship between the wave front measured by the exposure light and the wave front measured by the light other than the exposure light may be obtained from simulation, etc. Suppose, for example, an optical system having ideal imaging performance for the EUV light, and then the wave front aberration on an imaging surface is calculated by simulation when the light other than the exposure light (e.g. ultraviolet light, visible light, and infrared light) is used. The wave front aberration that has been converted into that for the EUV light reduces by minimizing a square sum of a difference between the wave front aberration measured with the light other than the exposure light and the aberration obtained from the above simulation.

Alternatively, a conversion equation from the wave front aberration measured with the light other than the exposure light to the wave front aberration measured with the exposure light may be experimentally determined. For instance, a base mirror barrel is prepared, the wave front aberration is measured with the EUV light, and the wave front aberration is reduced down to accuracy enough for exposure. Then, the wave front aberration of the base mirror barrel is measured, for example, with the visible light. The wave front aberration on imaging surfaces for each of the EUV light and visible light is developed into Zernike's polynomial, and a difference is calculated.

At the time of adjustment, the wave front aberration is measured by the visible light, and developed into Zernike's polynomial. The wave front aberration for the EUV light may be calculated by adding known difference.

In either case, the information on the wave front for the exposure light may be obtained from the wave front measurement using the light, such as ultraviolet light, visible light and infrared light, other than the exposure light.

Figure 14:
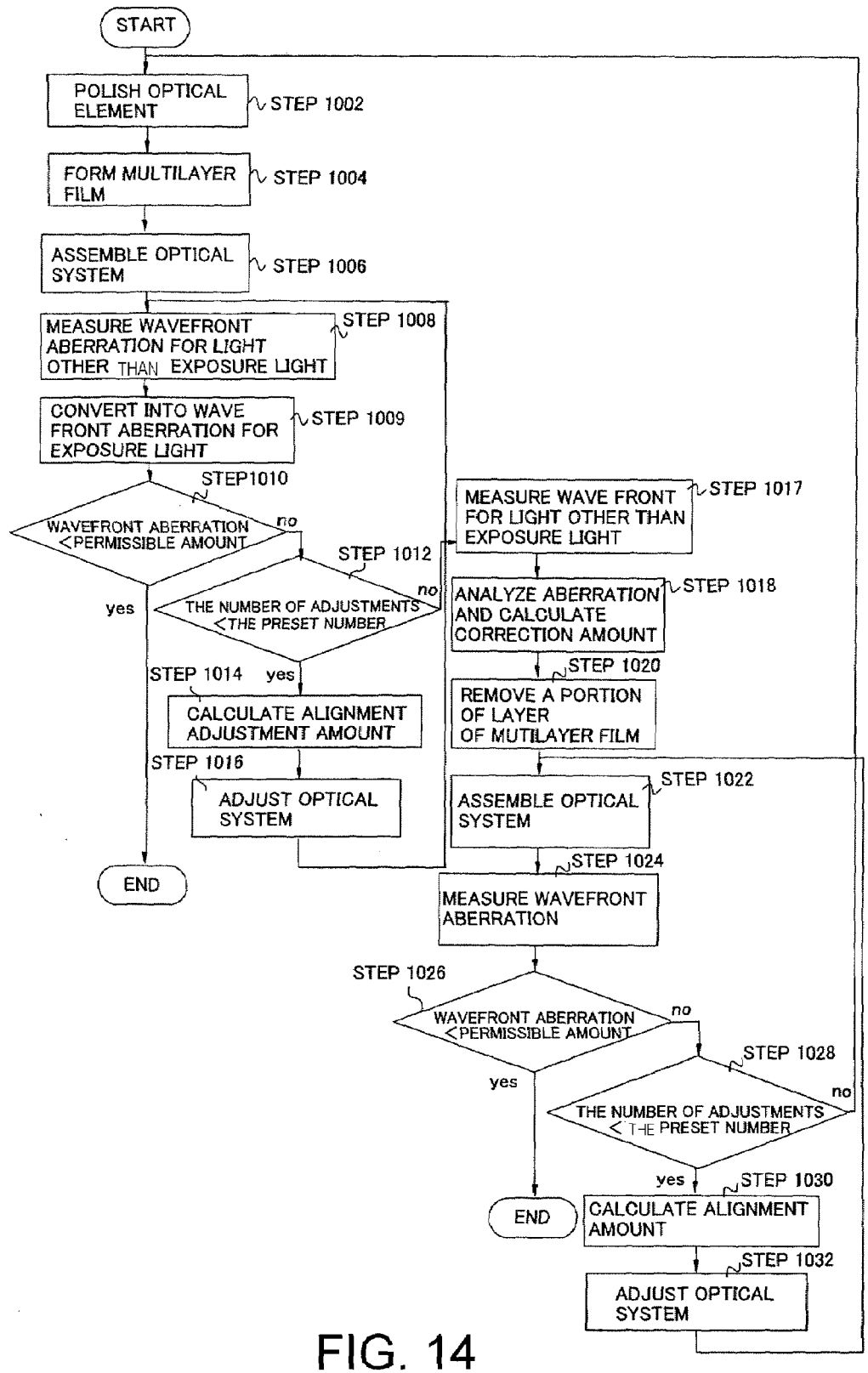
FIG. 14 is a flowchart for explaining an inventive adjustment method.

FIG. 14 shows a flow of the optical system adjustment in the third embodiment. The procedure to assemble an optical system up to the step 1006 is the same as those in the adjustment flows in the first embodiment and modification. The wave front measurement in the step 1008 uses the light other than the exposure light. The measured wave front is converted in the step 1009 into the wave front measured with the exposure light by the above method. The adjustment follows so that the amount of the converted wave front aberration may be below the permissible value.

The following adjustment flow is the same as that of the first embodiment shown in FIG. 12, but the wave front measurement step 1017 using the light other than the exposure light in FIG. 14 may be omitted since the step 1017 is replaceable with the wave front measurement step 1008 in FIG. 14.

According to the instant embodiment, the wave front aberration for the EUV light may be obtained from the wave front measurement using the light other than the exposure light (e.g. ultraviolet light, visible light, and infrared light), given a relationship of the wave front aberration between the light other than the exposure light and the EUV light. Therefore, the large facility, such as a synchrotron light source, is not necessary for manufacture, and an exposure apparatus with simple structure but having high imaging performance may be provided.

The first to third embodiments use the adjustment apparatus 100 to measure wave front aberration (in steps 1008 and 1024) for optical system assembly (in steps 1006 and 1022). This requires an additional step of assembling a projection optical system into an exposure apparatus after the adjustment apparatus finally adjusts the projection optical system, and the projection optical system is likely to generate aberration upon this assembly. Therefore, the above PDI is mounted onto the exposure apparatus so as to assemble the optical system and measure the wave front aberration. A description will now be given of a concrete method of measuring the wave front aberration applicable to this case using an exposure apparatus 700, which will be described in detail later with reference to FIG. 9.

First, a mirror is incorporated into a projection optical system 730 of the exposure apparatus (steps 1006 and 1022). Then, a wafer stage 745 and a mask stage 725 are driven so as to arrange, in an exposure area, a PS/PDI mask 778 on the wafer stage and a pinhole 776 on the mask stage.

Figure 13:
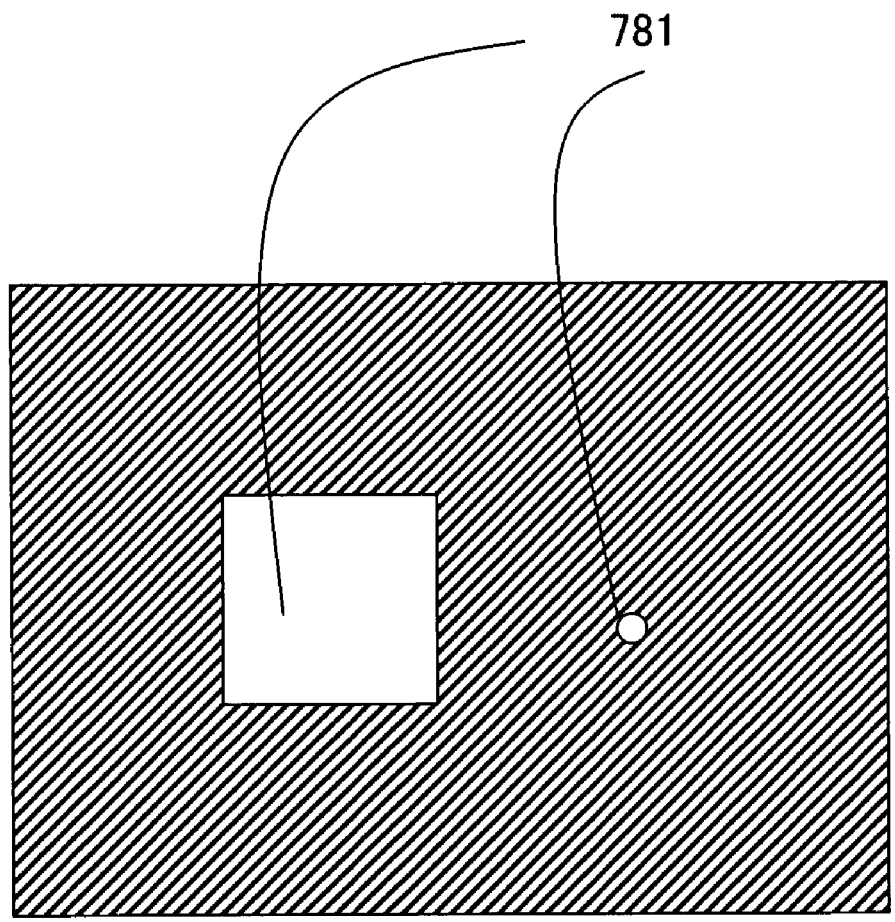
FIG. 13 is a view of a PS/PDI mask.

A light source 770 is provided which emits light (such as ultraviolet light, visual light, and infrared light) having a wavelength different from that of the exposure light, and the light from the light source 770 is introduced to the pinhole 776 provided on the mask stage 725 via the optical fiber 772 so as to generate spherical wave. The spherical wave is then divided into two by a diffraction grating 774 mounted onto a grating stage (not shown), and the wave front aberration of the projection optical system 730 may be measured on the exposure apparatus (steps 1008 and 1024) by detecting respective divided beams using detector means 780 (such as a CCD) via the projection optical system 730 and the PS/PDI mask shown in FIG. 13 on the wafer stage 745. Here, FIG. 13 is a view of the PS/PDI mask 780 provided on the wafer stage 745, which has openings 781. The wave front aberration measurement apparatus installed on the exposure apparatus may be used for the subsequent optical system assembly and wave front aberration measurement, even when the EUV light is used to measure the wave front aberration for coating milling.

In measuring the wave front aberration using the above exposure light (in step 1008 in FIGS. 1 and 12), a pinhole plate is arranged on the mask stage instead of a mask 720.

Fourth Embodiment

Figure 9:
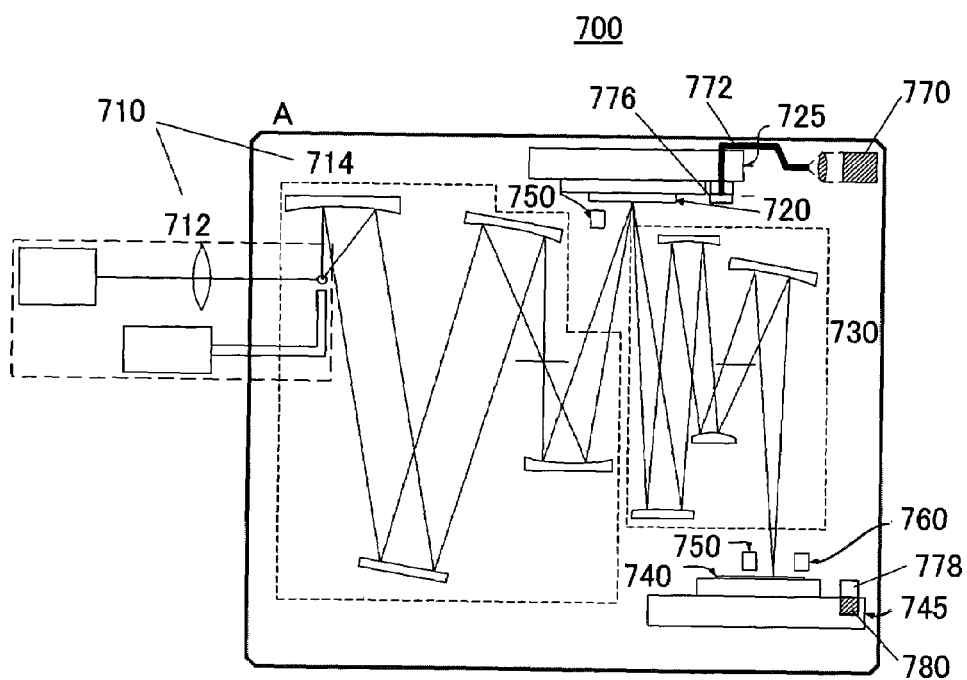
FIG. 9 is a schematic structure of an illustrative exposure apparatus according to the present invention.

A description will be given of an exemplary inventive exposure apparatus 700 with reference to FIG. 9. Here, FIG. 9 is a schematic structure of an illustrative inventive exposure apparatus 700. The inventive exposure apparatus 700 is a projection exposure apparatus 700 that uses EUV light with a wavelength of 13.4 nm as exposure light for step-and-scan exposure.

Referring to FIG. 9, the exposure apparatus 700 includes an illumination apparatus 710, a mask 720, a mask stage 725 that mounts the mask 720, a projection optical system 730, an object to be exposed 740, a wafer stage 745 that mounts the object 740, and an alignment detecting mechanism 750, and a focus position detecting mechanism 760.

An optical path through which EUV light passes is preferably maintained in a vacuum atmosphere "A" due to low transmittance to air of the EUV light, as shown in FIG. 9.

The illumination apparatus 710 uses arc-shaped EUV light, for example, with a wavelength of 13.4 corresponding to an arc-shaped field of the projection optical system 730 to illuminate the mask 720, and includes an EUV light source 712 and illumination optical system 714.

The EUV light source 712 employs, for example, a laser plasma light source. It generates high temperature plasma by irradiating a pulsed laser beam with high intensity onto a target material in a vacuum chamber, and uses the EUV light, for example, with a wavelength of about 13.4 nm, which has been emitted from the plasma. The target material may use a metallic thin film, an inert gas, a liquid-drop, etc., and the target supply unit may use a gas jet and so on. The pulse laser is usually driven with a higher repetitive frequency, such as several kHz, for increased average intensity of radiated EUV light.

The illumination optical system 714 includes a condenser mirror, an optical integrator, etc. The condenser mirror serves to collect the EUV light that is isotropically irradiated from the laser plasma. The optical integrator serves to uniformly illuminate the mask 720 with a predetermined NA. An aperture to limit the illumination area to an arc shape is also provided.

The mask 720 is a reflection-type mask that forms a circuit pattern or image to be transferred, and supported and driven by the mask stage 725. The diffracted light from the mask 720 is reflected by the projection optical system 730 and projected onto the object 740. The exposure apparatus 700 is a step-and-scan exposure apparatus, and projects a reduced size of the pattern on the mask 720 on the object 740 by scanning the mask 720 and the object 740.

The mask stage 725 supports the mask 720 and is connected to a moving mechanism (not shown). The mask stage 725 may use any structure known in the art. A moving mechanism (not shown) may include a linear motor etc., and drives the mask stage 725 at least in a direction X and moves the mask 720. The exposure apparatus 700 assigns the direction X to scan the mask 720 or the object 740, a direction Y perpendicular to the direction X, and a direction Z perpendicular to the mask 720 or the object 740.

The projection optical system 730 uses plural multilayer mirrors to project a reduced size of a pattern formed on the mask 720 onto the object. The number of mirrors is about four to six. For wide exposure area with the small number of mirrors, the mask 720 and object 740 are simultaneously scanned to transfer a wide area that is an arc-shaped area or ring field apart from the optical axis by a predetermined distance. The projection optical system 730 has a NA of about 0.1 to 0.3. The inventive adjustment apparatus 100 and adjustment method 1000 are applicable to an adjustment of the multilayer mirror in the projection optical system 730 for reduced wave front aberration and improved imaging performance.

The instant embodiment uses a wafer as the object to be exposed 740, but it may include a spherical semiconductor and liquid crystal plate and a wide range of other objects to be exposed. Photoresist is applied onto the object 740. A photoresist application step includes a pretreatment, an adhesion accelerator application treatment, a photoresist application treatment, and a pre-bake treatment. The pretreatment includes cleaning, drying, etc. The adhesion accelerator application treatment is a surface reforming process so as to enhance the adhesion between the photoresist and a base (i.e., a process to increase the hydrophobicity by applying a surface active agent), through a coat or vaporous process using an organic film such as HMDS (Hexamethyldisilazane). The pre-bake treatment is a baking (or burning) step, softer than that after development, which removes the solvent.

An object to be exposed 740 is held onto the wafer stage 745 by a wafer chuck. The wafer stage 745 moves the object 740, for example, using a linear stage in XYZ directions. The mask 720 and the object are synchronously scanned. The positions of the mask stage 725 and wafer stage 745 are monitored, for example, by a laser interferometer, and driven at a constant speed ratio.

The alignment detection mechanism 750 measures a positional relationship between the position of the mask 720 and the optical axis of the projection optical system 730, and a positional relationship between the position of the object 740 and the optical axis of the projection optical system 730, and sets positions and angles of the mask stage 725 and the wafer stage 745 so that a projected image of the mask 720 may be positioned in place on the object 740.

A focus detection optical system 760 measures a focus position in the direction Z on the object 740 surface, and control over a position and angle of the wafer stage 745 may always maintain the object 740 surface at an imaging position of the projection optical system 730 during exposure.

In exposure, the EUV light emitted from the illumination apparatus 710 illuminates the mask 720, and images a pattern formed on the mask 720 onto the object 740 surface. The instant embodiment uses an arc or ring shaped image plane, scans the mask 720 and object 740 at a speed ratio corresponding to a reduction ratio to expose the entire surface of the mask 720.

Fifth Embodiment

Figure 10:
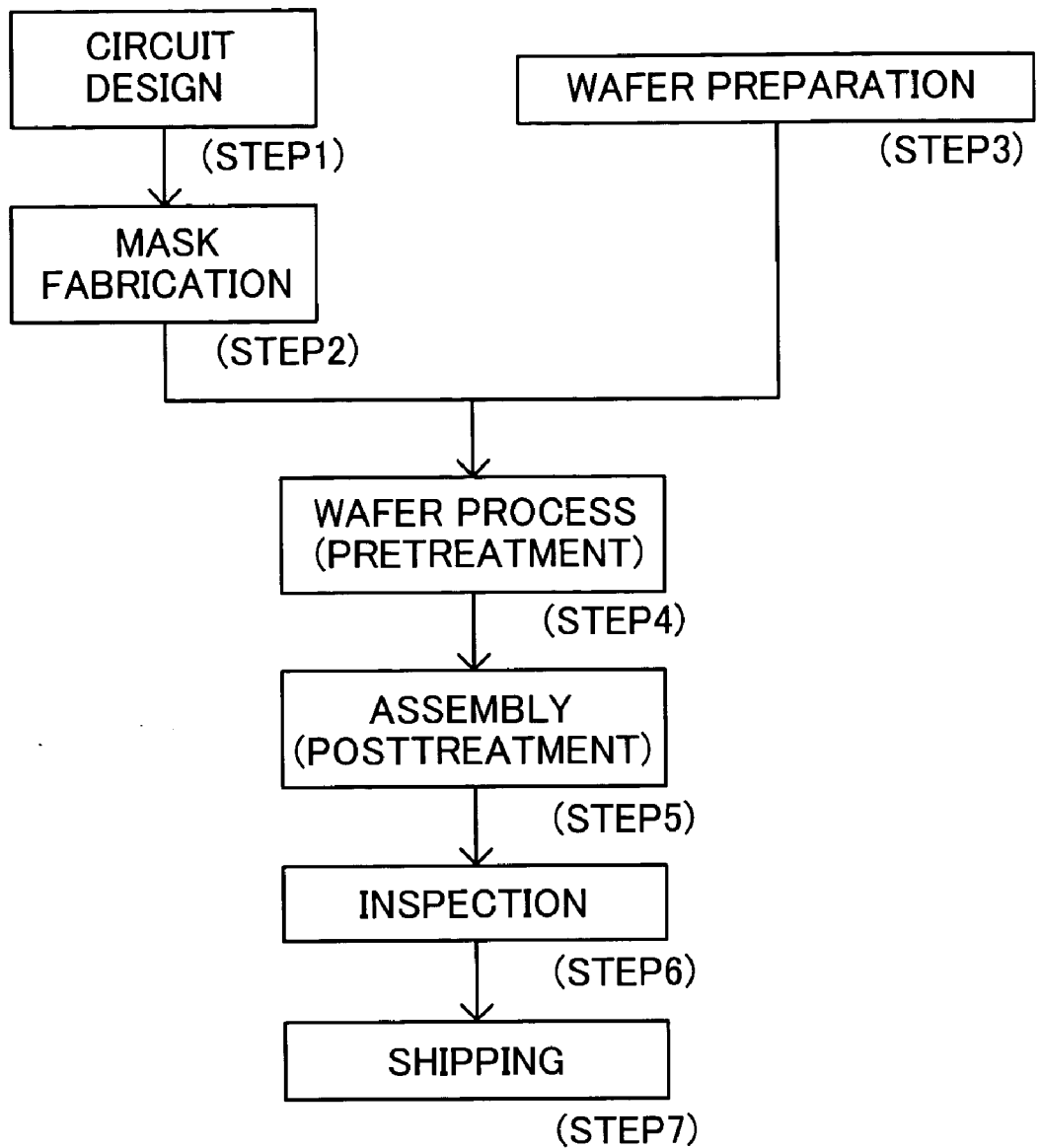
FIG. 10 is a flowchart for explaining how to fabricate devices (such as semiconductor chips such as ICs and LCDs, CCDs, and the like).
Figure 11:
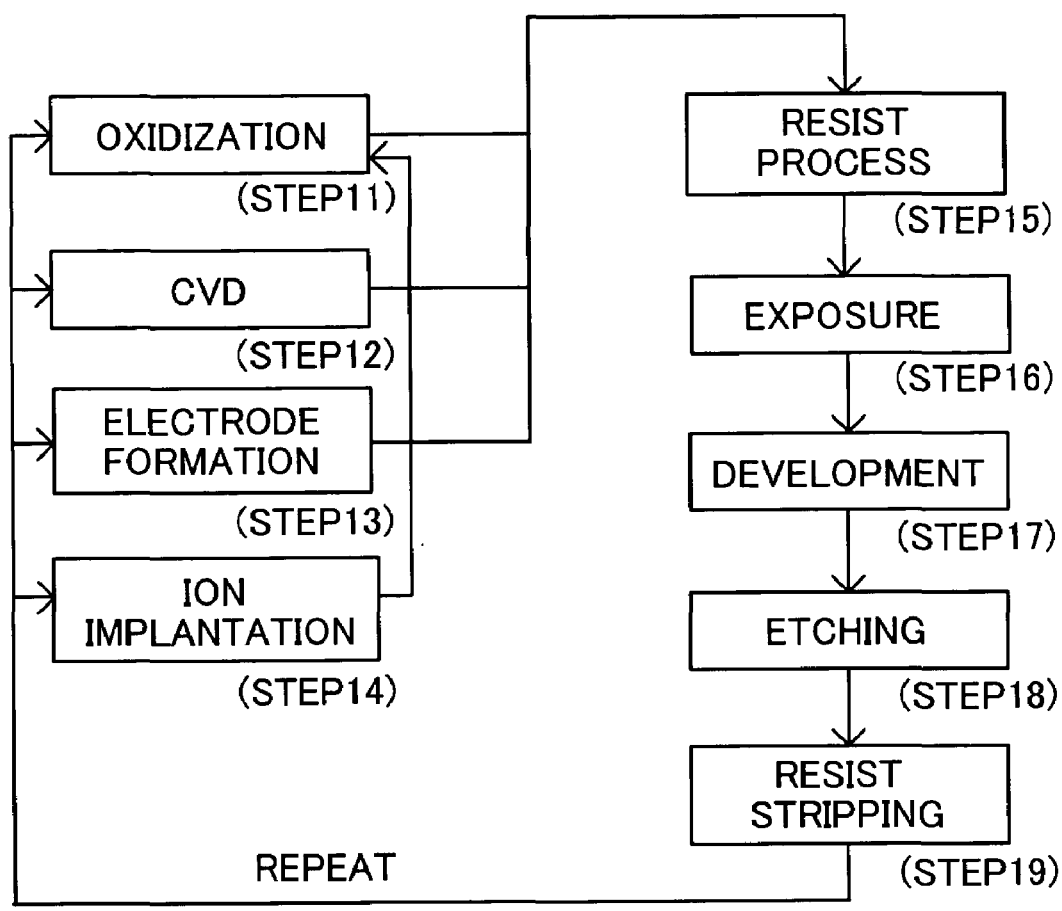
FIG. 11 is a detail flowchart of a wafer process as Step 4 shown in FIG. 10.

Referring now to FIGS. 10 and 11, a description will be given of an embodiment of a device fabricating method using the above exposure apparatus 700. FIG. 10 is a flowchart for explaining a fabrication of devices (i.e., semiconductor chips such as IC and LSI, LCDs, CCDs, etc.). Here, a description will be given of a fabrication of a semiconductor chip as an example. Step 1 (circuit design) designs a semiconductor device circuit. Step 2 (mask fabrication) forms a mask having a designed circuit pattern. Step 3 (wafer preparation) manufactures a wafer using materials such as silicon. Step 4 (wafer process), which is referred to as a pretreatment, forms actual circuitry on the wafer through photolithography using the mask and wafer. Step 5 (assembly), which is also referred to as a posttreatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 11 is a detailed flowchart of the wafer process in Step 4 in FIG. 10. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ion into the wafer. Step 15 (resist process) applies a photosensitive material onto the wafer. Step 16 (exposure) uses the exposure apparatus 200 to expose a circuit pattern on the mask onto the wafer. Step 17 (development) develops the exposed wafer. Step 18 (etching) etches parts other than a developed resist image. Step 19 (resist stripping) removes disused resist after etching. These steps are repeated, and multilayer circuit patterns are formed on the wafer. The device fabrication method of this embodiment may manufacture a higher quality device than the conventional method.

Further, the present invention is not limited to these preferred embodiments, and various variations and modifications may be made without departing from the scope of the present invention. For example, the present invention is applicable to an optical system that uses a multilayer mirror and other optical elements, such as a lens and diffraction grating. The present invention is also applicable, for example, to a projection optical system for ultraviolet light with a wavelength of 200 nm or smaller such as ArF excimer laser and $F_2$ laser, as well as an exposure apparatus that exposes a large screen through scanning/non-scanning.

Thus, the inventive adjustment apparatus and method may provide an optical system that stably transfer a fine pattern using the EUV light as well as other types of light by removing part of the multilayer mirror based on the wave front aberration generated in the entire optical system that has a multilayer mirror, and reducing the wave front aberration. Therefore, an exposure apparatus that uses such an optical system may provide high-quality devices with good exposure performance.

What is claimed is:

1. An adjusting method for adjusting an optical system that has a multilayer mirror that includes a multilayer film using an EUV light, said adjusting method comprising:
    a first step for measuring a wave front aberration of the optical system using the EUV light;
    a second step for measuring a wave front aberration of the optical system using a non-exposure light having a wavelength different from that of the EUV light;
    a third step for removing a part of the multilayer film based on a measurement result in said first step;
    a fourth step for measuring a wave front aberration of the optical system that includes the multilayer mirror from which the part of the multilayer film is removed, using the non-exposure light; and
    a fifth step for adjusting a position of the muitilayer mirror based on a measurement result in said fourth step,
    wherein said fourth step measures the wave front aberration of the optical system except an area in which the multilayer film is removed among the multilayer mirror.

2. An adjusting method according to claim 1, wherein the non-exposure light is one of a ultraviolet light, visible light and infrared light.

3. An adjusting method according to claim 1, further comprising a sixth step for incorporating into the optical system a mask for shielding a light from entering the area in which the multilayer film is removed in the multilayer mirror.

4. An adjusting method according to claim 1, further comprising a sixth step for incorporating into the optical system a mask for shielding a light reflected from the area in which the multilayer film is removed in the multilayer mirror.

5. An adjusting method according to claim 1, wherein said fourth step includes a data removal step for deleting data corresponding to a light through the area in which the multilayer film is removed in the multilayer mirror among measured date of the wave front aberration of the optical system, wherein said fifth step adjusts the position of the multilayer mirror using the data in the data removing step.

6. An optical system for using an EUV light, said optical system comprising a multilayer mirror having a multilayer film, wherein a part of the multilayer film is removed, and the optical system is adjusted by the adjusting method according to claim 1.

7. An exposure apparatus for exposing an object, wherein said exposure apparatus comprising an optical system according to claim 6 for introducing an EUV light from a light source to the object.

8. A device fabrication method comprising the steps of:
    exposing an object using an exposure apparatus according to claim 7; and
    performing a development process for the object exposed.

9. An adjusting method for adjusting an optical system that has a multilayer mirror that includes a multilayer film using an EUV light, said adjusting method comprising:
    a first step for measuring a wave front aberration of the optical system using a non-exposure light having a wavelength different from that of the EUV light;

a second step for removing a part of the multilayer film in the multilayer mirror based on a measurement result in said first step;

a third step for measuring a wave front aberration of the optical system that includes the multilayer mirror from which the part of the multilayer film is removed, using the non-exposure light; and a fourth step for adjusting a position of the multilayer mirror based on a measurement result in said third step, wherein said third step measures the wave front aberration of the optical system except an area in which the multilayer film is removed among the multilayer mirror.

10. An optical system for using an EUV light, said optical system comprising a multilayer mirror having a multilayer film, wherein a part of the multilayer film is removed, and the optical system is adjusted by the adjusting method according to claim 9.

11. An exposure apparatus for exposing an object, wherein said exposure apparatus comprising an optical system according to claim 10 for introducing an EUV light from a light source to the object.

12. A device fabrication method comprising the steps of:
exposing an object using an exposure apparatus according to claim 11; and
performing a development process for the object exposed.

13. An adjusting method for adjusting an optical system that has a multilayer mirror that includes a multilayer film using an EUV light, said adjusting method comprising:
a first step for measuring a wave front aberration of the optical system;
a second step for removing a part of the multilayer film in the multilayer mirror based on a measurement result in said first step;

a third step for measuring a wave front aberration of the optical system that includes the multilayer mirror from which the part of the multilayer film is removed, except an area in which the multilayer film is removed among the multilayer mirror; and a fourth step for adjusting the optical system based on a measurement result of wave front aberration of the optical system in said third step.

14. An adjusting method according to claim 13, further comprising a removal condition determining step for determining a removal condition to remove the part of the multilayer film in the multilayer mirror so that wave front aberration measured in said first step may reduce.

15. An adjusting method according to claim 14, wherein said removal condition defines a removal area of the part of the multilayer film in the multilayer mirror.

16. An adjusting method according to claim 14, wherein said removal condition defines a removal amount of the part of the multilayer film in the multilayer mirror.

17. An optical system for using an EUV light, said optical system comprising a multilayer mirror having a multilayer film, wherein a part of the multilayer film is removed, and the optical system is adjusted by the adjusting method according to claim 13.

18. An exposure apparatus for exposing an object, wherein said exposure apparatus comprising an optical system according to claim 17 for introducing an EUV light from a light source to the object.

19. A device fabrication method comprising the steps of:
exposing an object using an exposure apparatus according to claim 18; and
performing a development process for the object exposed.

* * * * *